US008174923B2

(12) United States Patent
Ware et al.

(10) Patent No.: US 8,174,923 B2
(45) Date of Patent: May 8, 2012

(54) VOLTAGE-STEPPED LOW-POWER MEMORY DEVICE

(75) Inventors: Frederick A. Ware, Los Altos Hills, CA (US); Yoshihito Koya, Tokyo (JP)

(73) Assignee: Rambus Inc., Sunnyvale, CA (US)

( * ) Notice: Subject to any disclaimer, the term of this patent is extended or adjusted under 35 U.S.C. 154(b) by 187 days.

(21) Appl. No.: 12/680,986

(22) PCT Filed: Jul. 22, 2008

(86) PCT No.: PCT/US2008/070758
§ 371 (c)(1),
(2), (4) Date: Mar. 31, 2010

(87) PCT Pub. No.: WO2009/061532
PCT Pub. Date: May 14, 2009

(65) Prior Publication Data
US 2010/0214822 A1    Aug. 26, 2010

Related U.S. Application Data

(60) Provisional application No. 60/986,582, filed on Nov. 8, 2007.

(51) Int. Cl.
*G11C 5/14* (2006.01)
*G11C 11/24* (2006.01)
(52) U.S. Cl. .......................... 365/227; 365/149; 365/226
(58) Field of Classification Search .................... 365/227
See application file for complete search history.

(56) References Cited

U.S. PATENT DOCUMENTS

| 4,661,929 | A | * | 4/1987 | Aoki et al. | 365/149 |
|---|---|---|---|---|---|
| 4,709,350 | A | | 11/1987 | Nakagome | |
| 5,222,044 | A | * | 6/1993 | Tsujimoto | 365/226 |
| 5,367,487 | A | * | 11/1994 | Yoshida | 365/189.09 |
| 5,570,005 | A | * | 10/1996 | Hardee et al. | 323/314 |
| 6,198,683 | B1 | * | 3/2001 | Ishii et al. | 365/226 |
| 6,343,044 | B1 | * | 1/2002 | Hsu et al. | 365/227 |
| 7,301,830 | B2 | * | 11/2007 | Takahashi et al. | 365/194 |
| 7,630,260 | B2 | * | 12/2009 | Kobayashi | 365/203 |
| 8,054,707 | B2 | * | 11/2011 | Ware | 365/222 |
| 2002/0024511 | A1 | * | 2/2002 | Ozawa | 345/204 |
| 2003/0048662 | A1 | | 3/2003 | Park | |
| 2003/0161190 | A1 | * | 8/2003 | Fujioka | 365/189.09 |
| 2006/0033553 | A1 | | 2/2006 | Hazucha | |
| 2006/0092686 | A1 | * | 5/2006 | Kang | 365/149 |

* cited by examiner

*Primary Examiner* — Son Mai
(74) *Attorney, Agent, or Firm* — Park, Vaughan, Fleming & Dowler LLP (57) ABSTRACT

This disclosure has described a system for charging a capacitive energy storage device of at least one memory cell within an integrated circuit device from an initial voltage to a final voltage, wherein the integrated circuit device includes a plurality of memory cells which are formed at least in part by capacitive energy storage devices. During operation, the system charges the capacitive energy storage device from the initial voltage to the final voltage stepwise through one or more progressively higher intermediate voltage levels using one or more voltage sources. Specifically, each intermediate voltage level is between the initial voltage and the final voltage, and each voltage source generates a respective intermediate voltage level. Note that charging the capacitive energy storage device through one or more intermediate voltage levels reduces energy dissipation during the charging process.

28 Claims, 10 Drawing Sheets

VOLTAGE-STEPPED LOW-POWER MEMORY DEVICE

TECHNICAL FIELD

The present embodiments relate to techniques for saving power within computer systems. More specifically, the present embodiments relate to methods and circuits for performing low-power memory operations within computer systems by using stepped voltages.

BACKGROUND

Advances in computing technology presently make it possible to perform trillions of computational operations per second on data sets that are sometimes as large as a trillion bytes. These advances can be largely attributed to the exponential increase in the operating speed and complexity of integrated circuits (ICs). Unfortunately, this increase in operating speed and complexity has been accompanied by a corresponding increase in power consumption. This increase in power consumption can create problems for mobile computing devices, because mobile computing devices usually suffer from stringent power constraints due to limited battery life. Note that within these devices, a large portion of the battery power is converted into thermal energy during normal system operation. As the IC technology continues to advance, this power consumption is increasingly becoming a limiting factor for performance in mobile computing devices.

Figure 1:
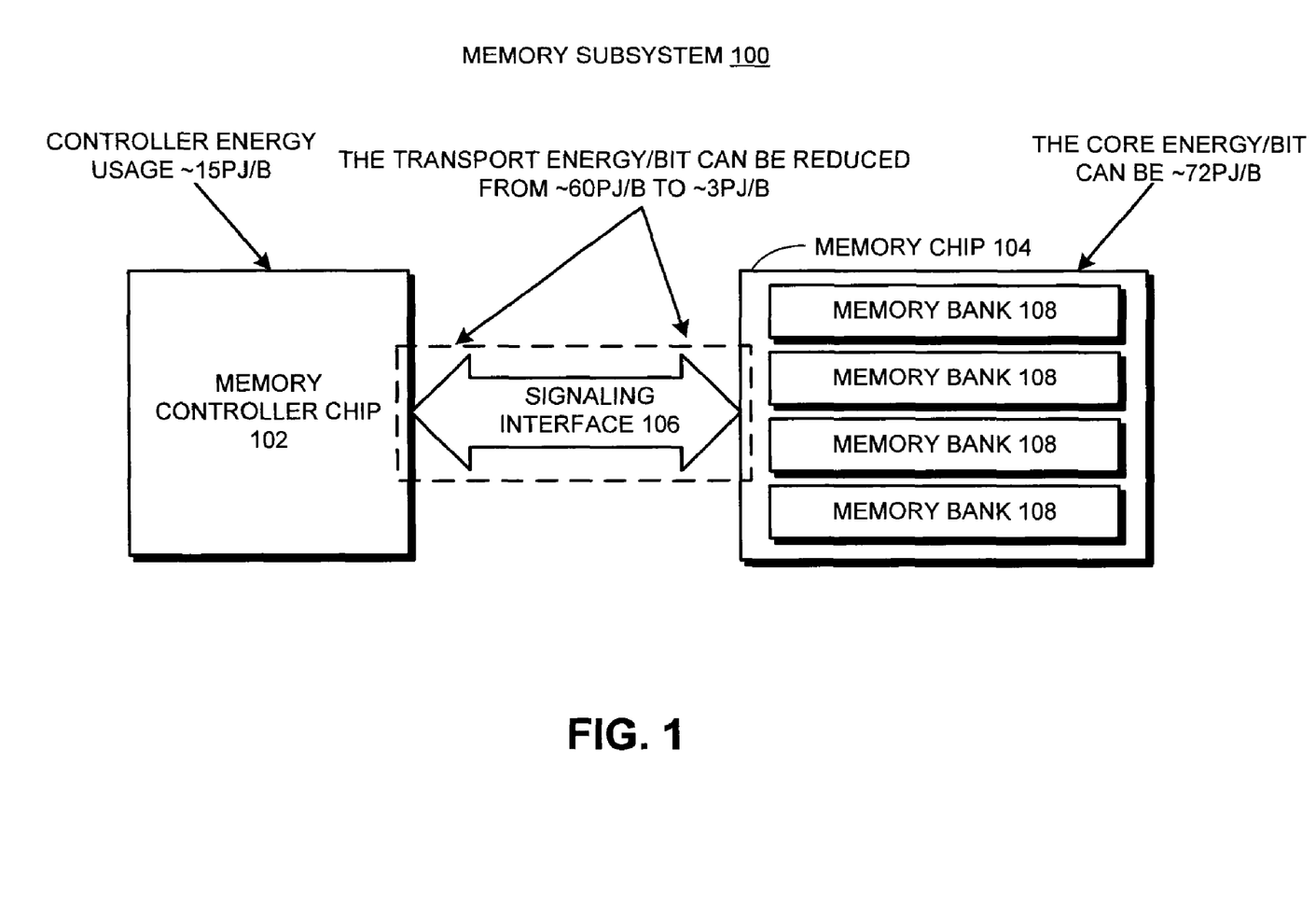
FIG. 1 presents a block diagram illustrating an embodiment of a typical memory subsystem which includes a memory controller integrated circuit (IC) chip coupled to a multi-bank memory IC chip through a signaling interface.

One of the main sources of power consumption within a computing device is the memory subsystem. A typical memory subsystem may include a memory controller IC chip ("controller chip" hereafter) coupled to one or more memory IC chips ("memory chips" hereafter) through a signaling interface. For example, FIG. 1 presents a block diagram illustrating an embodiment of a typical memory subsystem 100, which includes a controller 102 coupled to a multi-bank memory chip 104 through a signaling interface 106. While FIG. 1 illustrates memory subsystem 100 having one controller chip and four memory banks 108, other embodiments may have additional controller chips and/or fewer or more memory banks 108. In one embodiment, controller 102 and memory chip 104 are implemented on the same integrated circuit (IC) die. In other embodiments, they may be implemented on different integrated circuits.

Advances in signaling technology have dramatically lowered the amount of energy required to transport information between the controller chips and the memory chips. For example, the "per-bit" transport energy over the signaling interface 106 can be reduced from approximately 60 picoJoules (pJ) to approximately 3 pJ by using advanced signaling technology. However, the energy dissipation within memory chip 104, particularly when memory chip 104 is implemented as dynamic random access memory (DRAM) devices, has remained relatively high. For example, the energy dissipation during a memory cell (inside memory banks 108) access is approximately 72 pJ per bit for the DRAM devices disposed on a state-of-the-art small-outline dual-inline memory module (SODIMM). Note that energy dissipation inside the memory core continues to increase as memory devices operate at increasingly higher frequencies.

Hence, there is a need to provide a technique to reduce energy dissipation during memory core operations.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Overview

A low-power memory device and methods of operating and controlling the same are disclosed herein in various embodiments. In one embodiment, a multi-step low-power charging/discharging process, which involves using steppedvoltages to charge/discharge a capacitive energy storage device ("storage device" hereafter) through one or more progressively higher/lower intermediate voltages, is introduced. Analogously, low-power memory operations in a dynamic random access memory (DRAM) device comprising arrays of storage cells may be achieved by increasing/decreasing a supply voltage in the DRAM circuits stepwise (instead of using one single-step) through one or more progressively higher/lower intermediate voltage levels. In some embodiments, voltage-stepping circuits and/or other facilitating circuits (such as temporary storages cells) are provided to a DRAM device to facilitate voltage stepping and reducing energy dissipation during memory operations. These memory operations can include both row access operations (e.g., row activate operations) and column access operations (e.g., read or write operations that have been captured within a sense amplifier bank of a DRAM device), thereby substantially reducing the total energy dissipated during such memory access operations.

In other embodiments, multi-step sequencing between voltage levels for other types of memory storage cells may be employed (e.g., any type of memory cell in which charge transfer is carried out to effect data storage). In some embodiments, multi-step charging and discharging operations through a sequence of intermediate voltages can be employed to operate any type of capacitive energy storage device. Embodiments of bi-modal memory devices that may be switched between a voltage-stepped, lower-power operation mode and a normal, single-step full-power mode are also described.

Power Consumption During a Single-Step Charging/Discharging Operation

A typical memory chip structure comprises arrays of memory cells (or "cells"). These memory cells are frequently charged and discharged during refresh, read, and write operations. During these memory operations, currents flow through the wires between the memory cells and power sources (within the DRAM), causing energy dissipation through resistance with the circuitry.

Figure 2A:
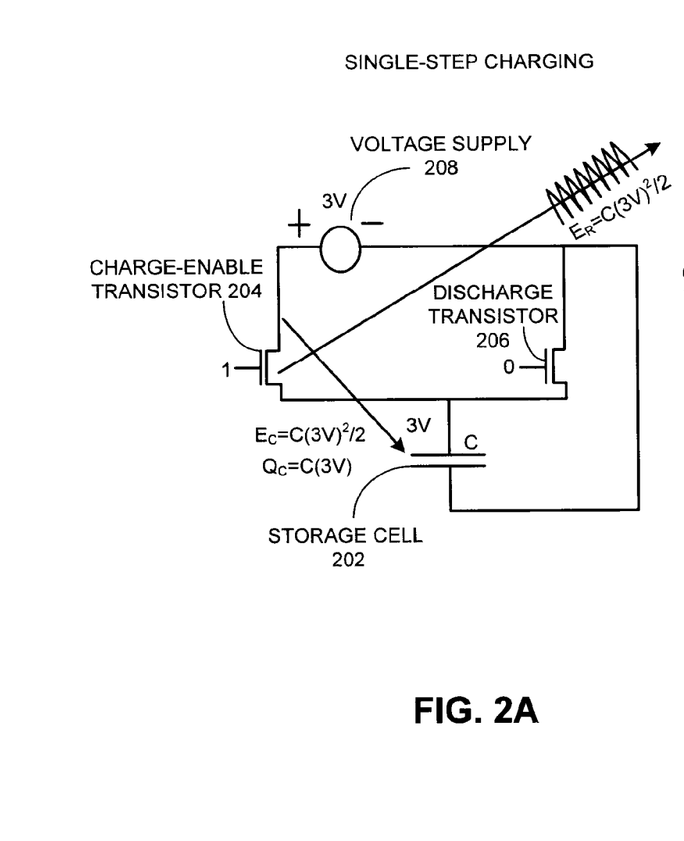
FIG. 2A illustrates a process for single-step charging a capacitive storage cell using a single supply voltage.
Figure 2B:
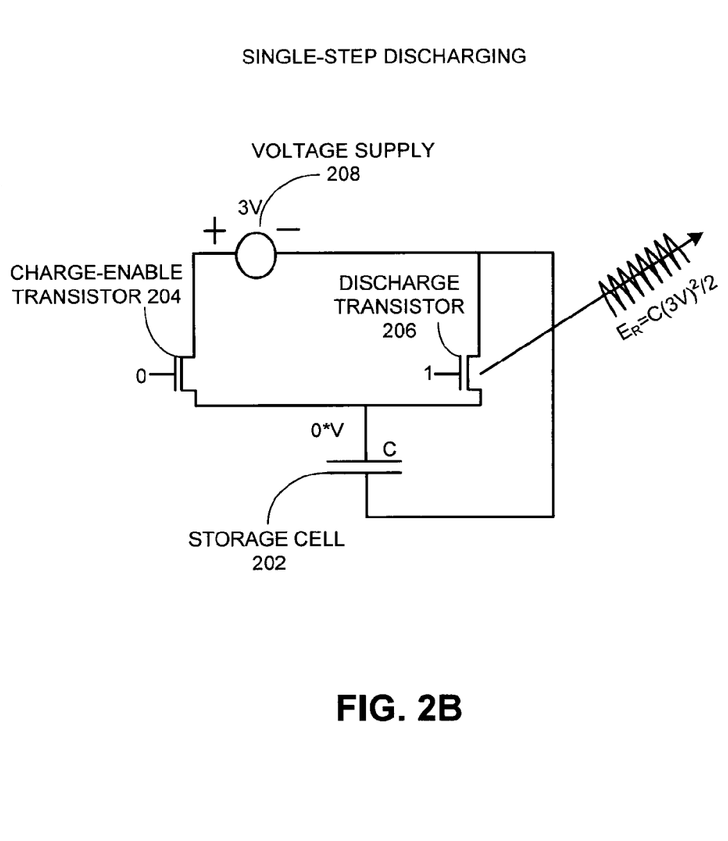
FIG. 2B illustrates a process for single-step discharging a capacitive storage cell.

For example, FIGS. 2A and 2B illustrate a power consumption model for the single-step charging/discharging of a capacitive storage cell 202 (such as a DRAM cell). Note that the charging and discharging operations are controlled by a charge-enable transistor 204 (also referred to as a "switching transistor" or an "access transistor") and a discharge transistor 206. More specifically, FIG. 2A illustrates the process for single-step charging of the capacitive storage cell 202 using a single voltage supply 208 at three volts. During this process, discharge transistor 206 is switched off (indicated by the number "0"), and charge-enable transistor 204, which is coupled between the capacitive storage cell 202 and voltage supply 208, is switched on (indicated by the number "1"). Consequently, a current flows through charge-enable transistor 204 to charge capacitive storage cell 202, in this example, from zero to three volts (i.e., the full supply voltage).

Note that upon completing the single-step charging operation, capacitive storage cell 202, having a capacitance of C, captures a charge $Q_C=C(3V)$, and thereby stores a total energy of $\frac{1}{2}C(3V)^2=4.5\,CV^2$. During the charging operation, voltage supply 208 outputs a total energy of Voltage× Charge=$3V(C(3V))=C(3V)^2=9\,CV^2$. Hence, of the total energy delivered, half is stored on the capacitive storage cell 202, while the other half or $4.5\,CV^2$ is dissipated in the resistance presented by the charge-enable transistor, and the charging loop. Note that although the charging voltage of voltage supply 208 may be lower (e.g., ~1 volt is a typical charging voltage in the current DRAMs), the same physical principles prevail, that is, half of the supplied energy is dissipated in the resistive elements (i.e., charge-enable transistor and wires), and the other half is captured on the capacitive storage element.

Similarly, FIG. 2B illustrates the process for single-step discharging of the capacitive storage cell 202. During this reverse process, discharge transistor 206 is switched on (indicated by the number "1"), and charge-enable transistor 204 is switched off (indicated by the number "0"). Hence, capacitive storage cell 202 and discharge transistor 206 form a discharging loop. Note that at the end of the discharge operation, the stored energy, which is equivalent to half of the transferred energy $4.5\,CV^2$, is likewise dissipated in the resistive element presented by the discharging loop. Hence, during the above-described charging/discharging cycle, a total of $9\,CV^2$ of battery power is converted to thermal energy and is effectively lost.

Power Consumption During Multi-Step Charging/Discharging Operation

Figure 3:
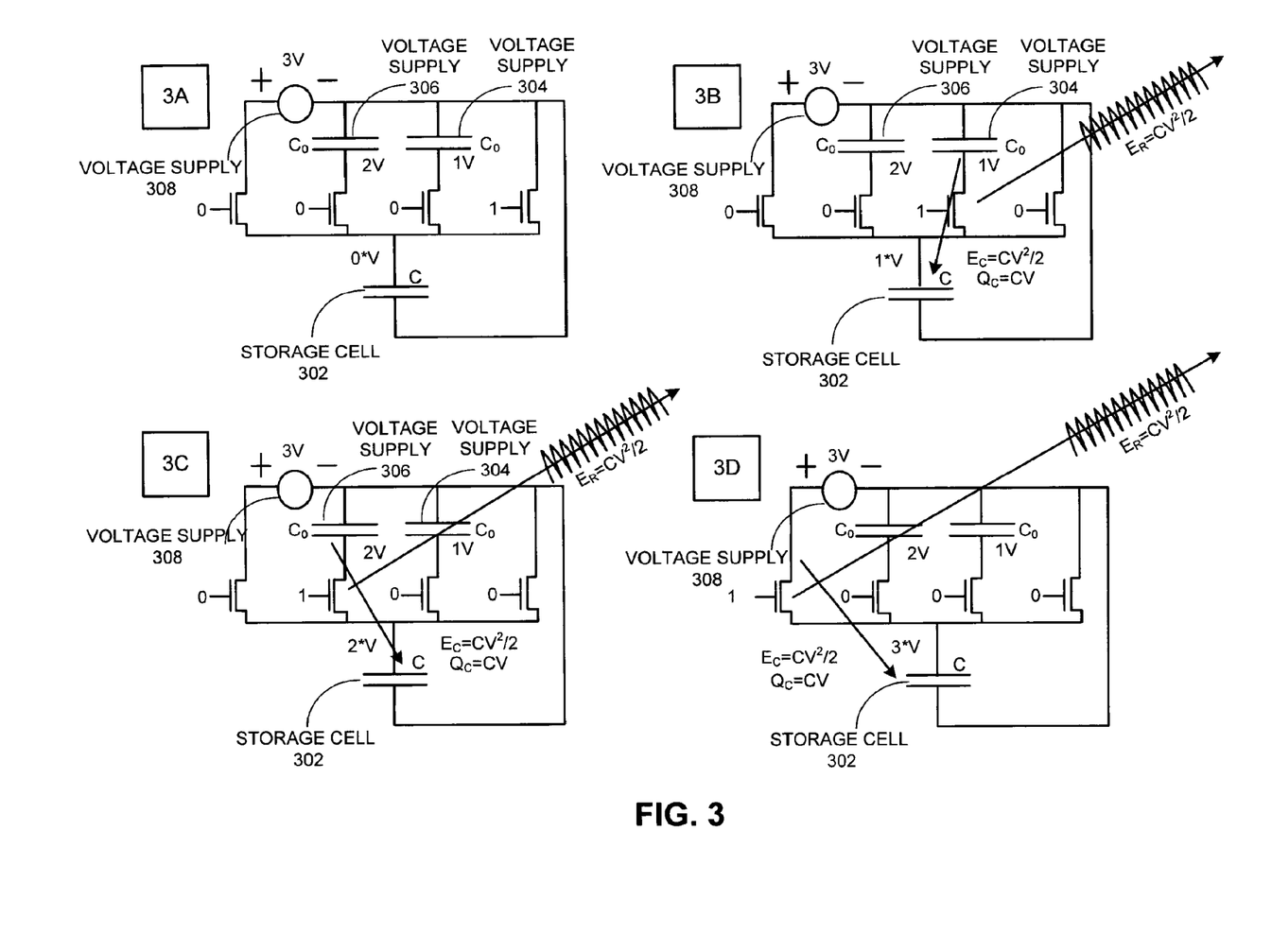
FIG. 3 illustrates a process for stepwise charging a capacitive storage cell (e.g., a DRAM memory cell) using multiple voltage supplies in a reduced-power embodiment.

FIG. 3 illustrates a process for stepwise charging of a capacitive storage cell 302 (e.g., a DRAM memory cell) using multiple voltage supplies in a reduced-power embodiment. As shown in FIG. 3, instead of simply coupling a single voltage source in series with capacitive storage cell 302, and thus charging the capacitive storage element from zero to a target voltage level in a single charging step, a sequence of intermediate voltage supplies are provided. More specifically, these intermediate voltage supplies and the target voltage supply can be switchably coupled to capacitive storage cell 302 one after another. This charges the capacitive storage element in a series of steps, wherein each step increases the voltage on the capacitive storage element by a fraction of the target voltage.

In the embodiment illustrated in FIG. 3, for example, two intermediate voltage supplies 304 and 306 at one volt and two volts, respectively, are provided in addition to the 3V target voltage supply 308. Note that each intermediate voltage supply is serially connected with a respective charging-enable transistor, which can be turned on and off individually (indicated by the number "0" or "1" as in FIGS. 2A and 2B).

Accordingly, the stepwise charging operation starts with a fully discharged (0V) state of storage cell 302 as illustrated in subplot 3A, wherein all three charging-enable transistors are switched off. During the first step as illustrated in subplot 3B, capacitive storage cell 302 is switched to couple with the first intermediate voltage supply 304 of 1V. Intermediate voltage supply 304 then charges capacitive storage cell 302 to 1V, which stores an amount of energy $0.5\,CV^2$, the energy dissipated during this step on the resistance is also $0.5\,CV^2$. Next, during the second step in subplot 3C, capacitive storage cell 302 is switched to couple with the intermediate voltage supply 306 of 2V, which charges capacitive storage cell 302 from 1V to 2V. Similarly, because the relative voltage difference between the starting state of step 3C of the capacitive storage element and the intermediate voltage level is also 1 volt, the energy dissipated on the resistance during this step is also $0.5\,CV^2$. During the third step and final step as illustrated in subplot 3D, capacitive storage cell 302 is switched to the target voltage supply of 3 volts, which eventually charges the storage element to the target voltage of 3V. Once again, only $0.5\,CV^2$ of energy will be dissipated during the third step.

Note that each of charging steps 3B, 3C and 3D is performed by switchably coupling a corresponding stepped and increasingly higher voltage source (i.e., 1V, 2V and then 3V) to the capacitive storage element (such as a DRAM cell). Although the capacitive storage element is eventually charged to the same level (i.e., 3V) as the single-step charging process of FIG. 2, the energy dissipated during the three-step charging processes is $0.5\,CV^2+0.5\,CV^2+0.5\,CV^2=1.5\,CV^2$, which is one-third of the energy dissipated in the single-step-operation, which is $4.5\,CV^2$.

Note that although the embodiment of FIG. 3 uses two intermediate voltage supplies and three charging steps, other embodiments can use a larger or smaller number of intermediate voltage supplies and charging steps. Generally, using N (N≧2) charging steps to reach a target voltage level when charging a capacitive storage element can save power in comparison to using a single charging step to reach the same target voltage level. Furthermore, although the embodiment of FIG. 3 is described in terms of equal-sized voltage steps, other embodiments can use approximately equal-sized steps or uneven voltage steps.

The reason for this power savings is that, because the energy dissipation is a function of the square of the charging potential (i.e., the voltage difference between the charging voltage and the voltage on the capacitive storage element at the start of the charging step), a smaller charging potential (V) through "N" discrete charging steps causes a total energy dissipation proportional to N×V$^2$ to reach a final NV voltage level. In contrast, a single-step charging operation yields a total energy dissipation proportional to (NV)$^2$. Consequently, only 1/Nth of energy which is dissipated in the single-step charging process is dissipated in the N-step charging process. Hence, using more intermediate voltage levels (i.e., by increasing the value of N) can further reduce energy dissipation during the charging process. From a mathematical perspective, the power savings can be appreciated from the inequality: $A^2+B^2<(A+B)^2$, or $\Sigma A_i^2<(\Sigma A_i)^2$ wherein $A_i>0$.

Note that a discharging process can be considered as the reciprocal of the charging process. Hence, the same energy dissipation and power savings can be achieved by discharging the capacitive storage element using multiple intermediate voltage sources with progressively lower voltage levels. In summary, for each charging-discharging cycle for a capacitive storage element, power savings can be achieved by using a multi-step charging process, a multi-step discharging process, or both.

Figure 4A:
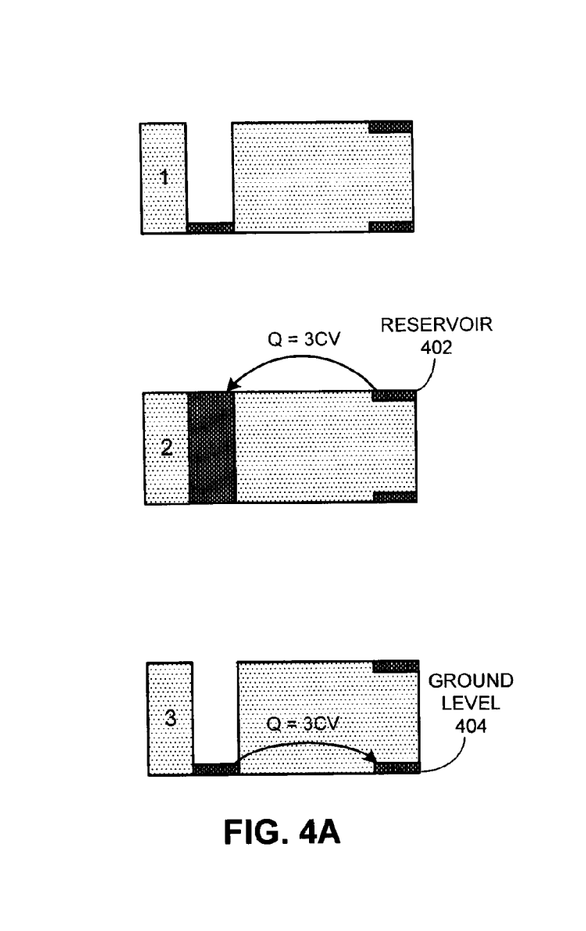
FIG. 4A illustrates a process for filling and draining a tank with a single large step in an analogy to a single-step charging and discharging process described with reference to FIG. 2.
Figure 4B:
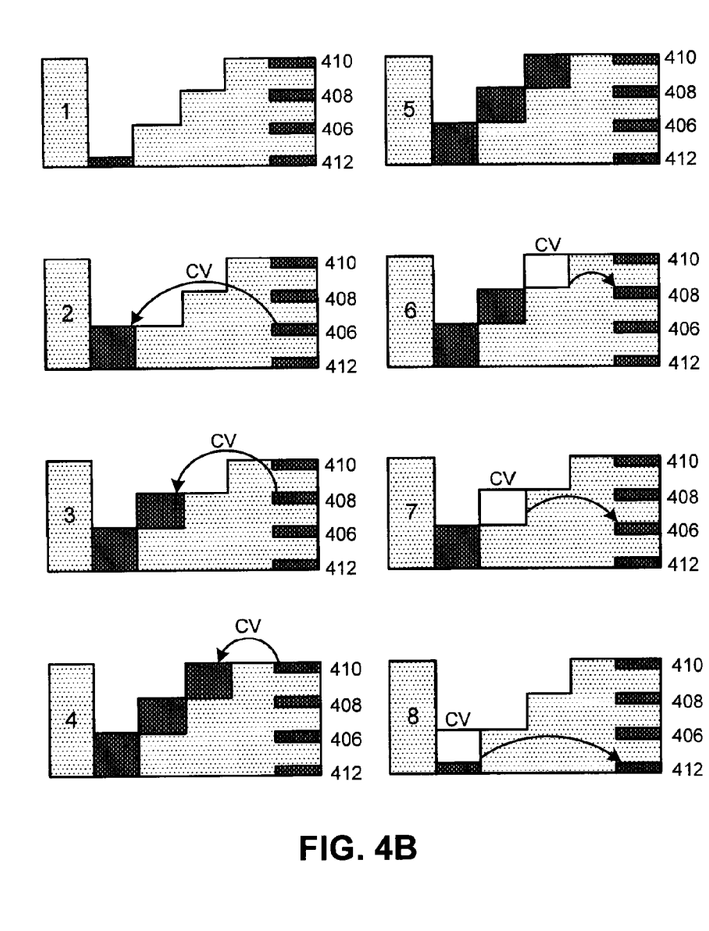
FIG. 4B illustrates a process for filling and draining a tank with multiple smaller steps in an analogy to a multi-step charging/discharging process described with reference to FIG. 3.

The principle of power savings in the above-described multi-step charging/discharging process can be illustrated using a water-tank analogy. More specifically, FIGS. 4A and 4B comparatively illustrate the processes of filling and draining a water tank to clarify how charging and discharging with multiple relatively small steps (i.e., progressively raising and then lowering the supply voltage) reduces energy dissipation compared with a single-step operation. Note that in this analogy, the capacitance of the storage element is represented by the cross-sectional area of the tank, and the voltage level is represented by the height of the water surface. Hence, the charge being transferred is represented by the certain volume of water in the tank, shown as a shaded region to represent the volume of water in the tank.

FIG. 4A illustrates the process for filling and draining a tank with a single large step in an analogy to a single-step charging and discharging process described with reference to FIG. 2. Specifically, the three numbered states 1 to 3 relate to the single-step charging (state 1 to state 2) and single-step discharging (state 2 to state 3), respectively. At state 1, an empty tank (cross-sectional area, S=C, height H=0V) will be filled with water from a reservoir. In the case of single-step-charging (i.e., filling the tank), the vertical height of the reservoir 402 is parallel to the tank's rim, that is at 3V. At state 2, a volume of 3 CV of water is transferred from the reservoir 402 to the tank, thereby filling the tank. Next, at state 3, the tank is emptied by lowering the water mass 3 CV to the ground level 404. At the end of this process, the total amount of energy that has been dissipated (charge times voltage) is 3 CV times 3V (3V is the vertical distance or potential between the bottom of the tank and the height of the reservoir 402). In other words, when transitioning from a discharged state to a fully charged state (empty tank to full tank) and then back to the discharge state (state 1 to state 2, and then from state 2 to state 3) 9 CV$^2$ has been dissipated.

Now consider FIG. 4B, which illustrates the processes for filling and draining a tank with multiple smaller steps in an analogy to a multi-step charging and discharging process described with reference to FIG. 3. Specifically, the first four numbered states (state 1 to state 4) represent the multi-step charging process and the last four numbered states (state 5 to state 8) represent the multi-step discharging process. At state 1, an empty tank (cross-sectional area, S=C, height of water level H=0V) will be filled with water from three reservoirs at the height of V, 2V, and 3V, respectively. From state 2 to state 4, the tank is successively filled with water from the lowest reservoir 406 first, then from the next highest reservoir 408, and finally from the highest reservoir 410. At each filling step, a volume of CV water is transferred out of a respective reservoir. Finally the tank is filled with 3 CV volume (state 4 and state 5).

During the draining process (state 6 to state 8), a volume of CV water flows back to the second highest reservoir 408 (state 6), then another volume of CV water flows back to the lowest reservoir 406 (state 7), and the last ⅓ portion of water is drained to the ground level 412 of zero height (state 8). Note that the end effect of this filling-draining process is that the water storage in the two lower reservoirs remains unchanged, while a volume of water CV has been transferred from the highest reservoir 410 to the ground level 412. This is equivalent to an amount energy of CV times 3V (or 3 CV$^2$) being dissipated through the entire process, versus the 9 CV$^2$ dissipation in the single-step-process, thus effectively lowering the total energy dissipation by ⅓. Note that, analogous to the water being returned to the reservoirs, during the stepwise discharging process, parts of the charge may be restored back to the intermediate voltage nodes and hence can be "reused" during the next charging process.

Low-Power Operation within a Capacitive Memory Device

Because a DRAM memory device uses capacitive storage elements (i.e., the storage cells) to store information (i.e., the charge), and each memory operation, such as read, write and activate/refresh, involves charging or discharging the storage cells, in some embodiments, power savings in DRAM memory operations may be achieved through multi-stepped charging and discharging as illustrated in FIG. 3 instead of using conventional single-step charging/discharging operation as illustrated in FIGS. 2A and 2B).

More specifically, a low-power operation mode can be achieved in a memory cell by first determining if a memory access involves a charging or a discharging operation. Next, if the memory access involves a charging operation, the system can perform the charging operation in multiple steps from a low voltage to a target high voltage using one or more progressively higher intermediate voltage sources. Conversely, if the memory access involves a discharging operation, the system can perform the discharging operation in multiple steps from a high voltage to a target low voltage through one or more progressively lower intermediate voltage sources. Embodiments of this low-power operation mode are described in more detail below.

Figure 5:
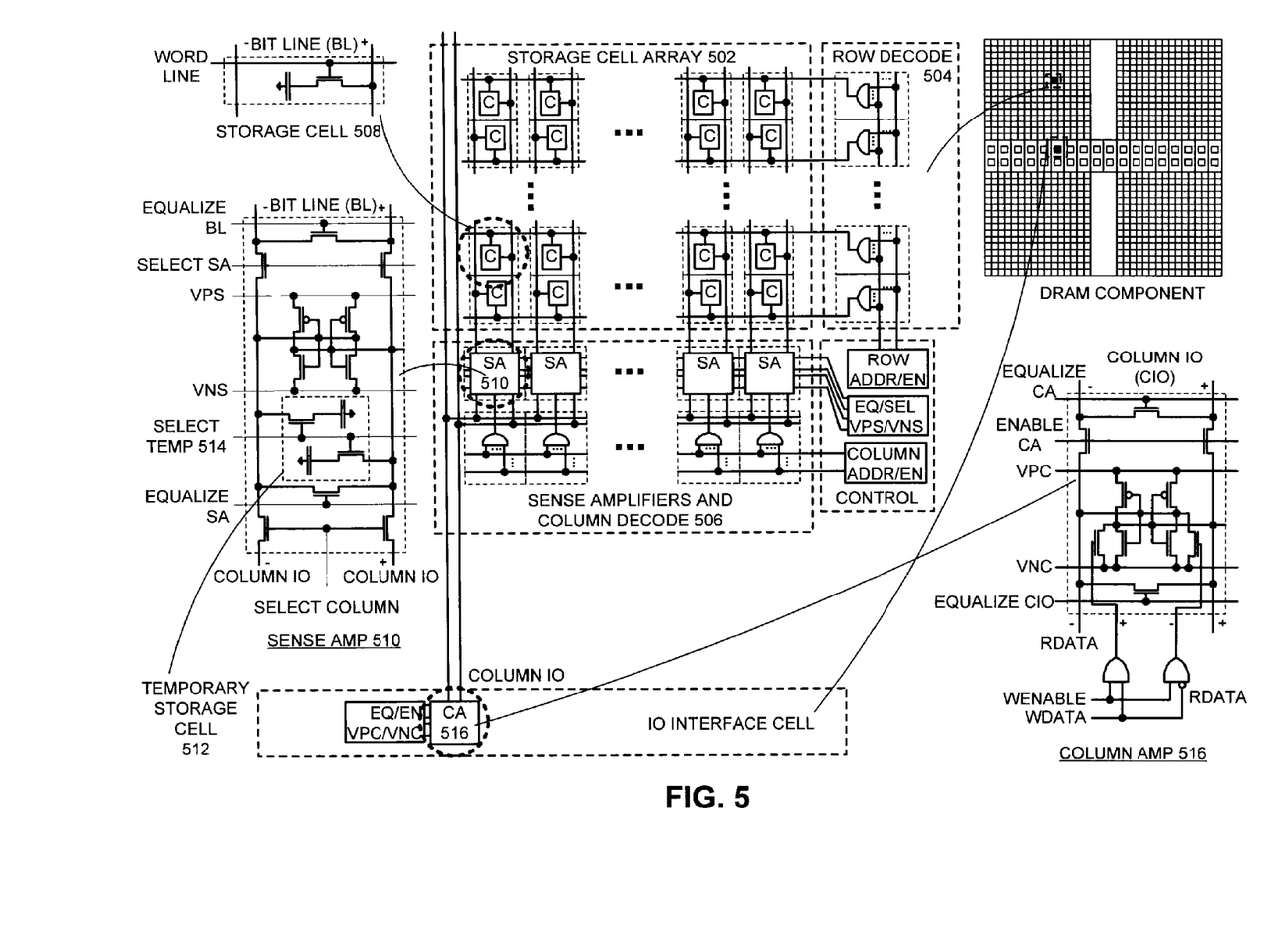
FIG. 5 illustrates an embodiment of a DRAM core structure wherein the sense amplifier cells and column amplifier cells have been augmented with additional control lines and control circuitry to enable stepwise charging and discharging operations.

FIG. 5 illustrates an embodiment of a DRAM core structure wherein the sense amplifier (also referred to as "SA" or "sense amp" hereafter) cells and column amplifier (also referred to as "CA" or "column amp" hereafter) cells have been augmented with additional control lines and control circuitry to enable stepwise (i.e., "stepped" or "multi-step") charging and discharging operations. More specifically, the center of FIG. 5 shows a storage cell array 502 which comprises multiple rows and multiple columns of memory cells (which are labeled with a letter "C"). Note that individual cells in cell array 502 are addressed through row decode circuit 504 shown on the right hand side of the array, and column decode circuit 506 shown at the bottom of cell array 502. An embodiment of a typically DRAM storage cell 508 is shown in the upper left of FIG. 5.

Cell array 502 also comprises a set of sense amps (also referred to as "SA bank"), for example sense amp 510, and a set of column amps (also referred to as "CA bank"), such as column amp 516. Each sense amp performs the row access (e.g., in a row activate operation or a row refresh operation), and each column amp performs the column access (e.g., in a column read or a column write operation).

An embodiment of sense amp 510 is shown on the left of cell array 502 in FIG. 5. Note that within sense amp 510, a pair of voltage nodes "VPs" and "VNs" are used to power the latching elements (i.e., the back-to-back inverters) disposed between these voltages nodes. When data is written into a row of memory cells within the storage array 502, these sense amplifiers (and more specifically the VPs and VNs voltage nodes) are coupled to external voltage sources to provide the charging and discharging voltages to the storage cells. In some embodiments, to perform low-power memory operations, VPs and VNs voltage nodes can be coupled to a set of stepped (or intermediate) supply voltages via supply-voltage-stepping circuitry, which is configured to gradually step between voltage states that correspond to completely discharged and completely charged voltages. Also note that sense amp 510 comprises a temporary storage cell 512, which is accessed through a "select temp" signal 514. More detailed operation of temporary storage cell 512 is provided below in conjunction with FIGS. 7-9.

Referring back to FIG. 5, note that an embodiment of column amplifier 516 is shown at the bottom right of FIG. 5. In this embodiment, voltage nodes, VPc and VNc are used to power the latching elements (back-to-back inverters in this example) within the column amplifier 516. When writing data into a column of memory cells, these column amplifiers (and more specifically the VPc and VNc voltage nodes) are coupled to external voltage sources to provide the charging and discharging voltages to the storage cells. In some embodiments, to perform low-power memory operations, VPc and VNc voltage nodes can (similar to the above-described VPs and VNs nodes) be coupled to a set of stepped (or intermediate) supply voltages via a supply-voltage-stepping circuitry, which is configured to gradually step between voltage states that correspond to completely discharged and completely charged voltage levels.

In some embodiments, both VPs and VNs voltage nodes and the VPc and VNc voltage nodes can be coupled to the same type of supply-voltage-stepping circuitry. This supply-voltage-stepping circuitry and its operation are described in more detail in conjunction with FIG. 6.

Figure 6:
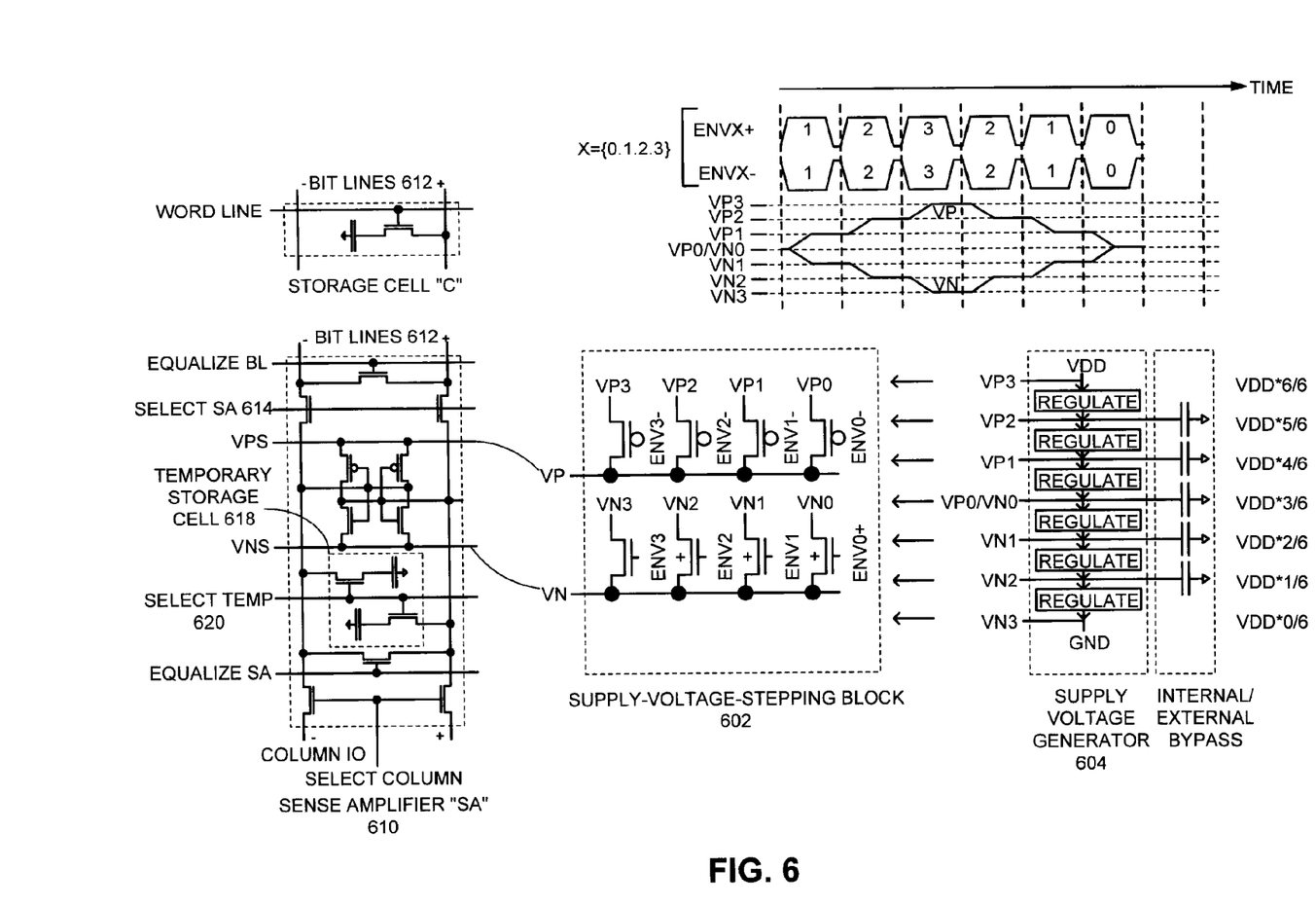
FIG. 6 illustrates an embodiment of a voltage-stepping circuitry for applying a sequence of progressively higher or lower voltages to data lines (i.e., bit lines or column I/O lines) in respective time intervals.

FIG. 6 illustrates an embodiment of a voltage-stepping circuitry for applying a sequence of progressively higher or lower voltages to data lines (i.e., bit lines or column I/O lines) in respective time intervals.

More specifically, a supply-voltage-stepping block 602 is shown in the center of FIG. 6. Supply-voltage-stepping block 602 comprises a set of stepped voltage levels, wherein each voltage level is formed by a pair of voltage nodes, VPi/VNi, wherein i=0, 1, 2, and 3. In one embodiment, VP3 and VN3 correspond to the actual supply voltages (also referred to as "rail-to-rail voltages" and "minimum-maximum voltages") provided to the memory chip (e.g., IC supply voltages VDD and GND). The intermediate voltages VP2/VN2, VP1/VN1, VP0/VN0 may be synthesized or generated from the rail-to-rail supply voltages. For example, as illustrated in FIG. 6, a supply voltage generator 604 using voltage regulators is provided to ensure that a set of stepped voltages between VDD and GND remain properly spaced and are ready to use.

More specifically, supply voltage generator 604 uses six serially connected voltage regulators coupled between VDD and GND to generate a set of intermediate voltage nodes. In this embodiment, each voltage step produced by a regulator equals ⅙VDD, and the equilibrium midpoint of the set of stepped voltages is ½VDD in the middle of the supply voltage range. Note that because each voltage regulator moves only a small fraction of the charge between voltage nodes (while most of the charge is moved by the symmetrical sequencing of the supply-voltage-stepping block), the regulators will consume a relatively small amount of energy, and the stepped voltage sources (or nodes) are maintained by the bypass capacitors shown on the far right of supply voltage generator 604. These bypass capacitors may be disposed on-chip, off-chip or formed by a combination of on-chip and off-chip capacitors.

Referring back to supply-voltage-stepping block 602 in FIG. 6, note that in this embodiment, the intermediate supply voltage nodes VPi/VNi (i=0, 1, 2) are statically generated and held in reserve with switches (shown as transistors ENVx) disposed physically near the cells to enable sequenced stepping through the statically generated voltages. These switches in supply-voltage-stepping block 602 can be sequentially enabled two at a time. More specifically, as shown in the timing diagram at the top of FIG. 6, an exemplary charging/discharging cycle involves asserting a sequence of different control signal pairs, ENVx+ and ENVx− (wherein x is an integer 0, 1, 2 or 3 as shown in the waveform), in consecutive time intervals to enable each pair of switches in the stepping block 602. Accordingly, the control signals produce a stepped voltage supply waveform starting from VPN0/VN0 (the equilibrium midpoint, wherein VPN0=VN0) and progressing to VP1/VN1, then to VP2/VN2 and finally to VP3/VN3 in the charging half of the cycle, and then reversing that sequence through VP2/VN2, VP1/VN1, and VPN0/VN0 for the discharging half of the cycle. Note that by using the supply-voltage-stepping block 602 to supply voltages to the sense amps or column amps, power savings can be achieved during memory operations which involve charging/discharging of storage cells.

With regard to the final supply voltage on a sense amp or a column amp at the end of a charging/discharging cycle, because the differential voltage produced by a pair of voltage nodes eventually returns to an equilibrium midpoint (i.e., VP0=VN0), the charging voltage may be controlled so that it is just high enough to create a signal that can be received at the remote end (e.g., within a memory cell if used to power the bit lines, or within a temporary storage cell (as shown in FIG. 5) if referring to the column I/O lines), and can be varied depending on the position of the cell to be charged within the memory chip.

Note that other than statically generating the intermediate supply voltages VPi/VNi, the intermediate supply voltages may also be generated from IC supply voltages at run-time (i.e., dynamically generated during a charging/discharging operation).

Note that an alternative technique to achieve the stepwise charging and discharging process involves creating those intermediate voltages from the IC supply (VP3, VN3) using a DC-DC converter or buck converter. Such a DC-DC (switching) converter can use the VP3/VN3 rail voltage to generate the intermediate voltages VP2/VN2 with high efficiency. The intermediate voltages VP1/VN1 and VP0/VN0 can be maintained with lower efficiency regulators (such as linear-type regulators), because they only need to provide small amounts of current. The majority of the current flow will be from VP3 through the high-efficiency DC-DC regulator component to VP2, and from VP2 to VP1 to VP0/VN0 to VN1 to VN2 via the voltage-stepping mechanism shown in FIG. 6, and from VN2 to VN3 via the high-efficiency DC-DC regulator component.

Note that, after a row-activate operation, the sense amplifiers such as sense amp 610, may remain connected to (and thus continually driving) the bit lines 612. In another embodiment, as shown in FIG. 6, a "select SA" signal 614 may be used to decouple the sense amplifier 610 from bit lines 612 after row data has been captured in the sense amplifier bank.

Still referring to FIG. 6, note that during a write operation, data is transferred from the memory IC interface into the memory storage array, and the write operation includes overwriting the contents of the sense amplifier bank with the data delivered via the column I/O lines. In one embodiment, a temporary storage cell 618 (shown in a dashed box) is provided within the sense amplifier 610 and accessed in response to the assertion of a select temp signal 620. The purpose and operation of temporary storage cell 618 is discussed below in greater detail.

Figure 7:
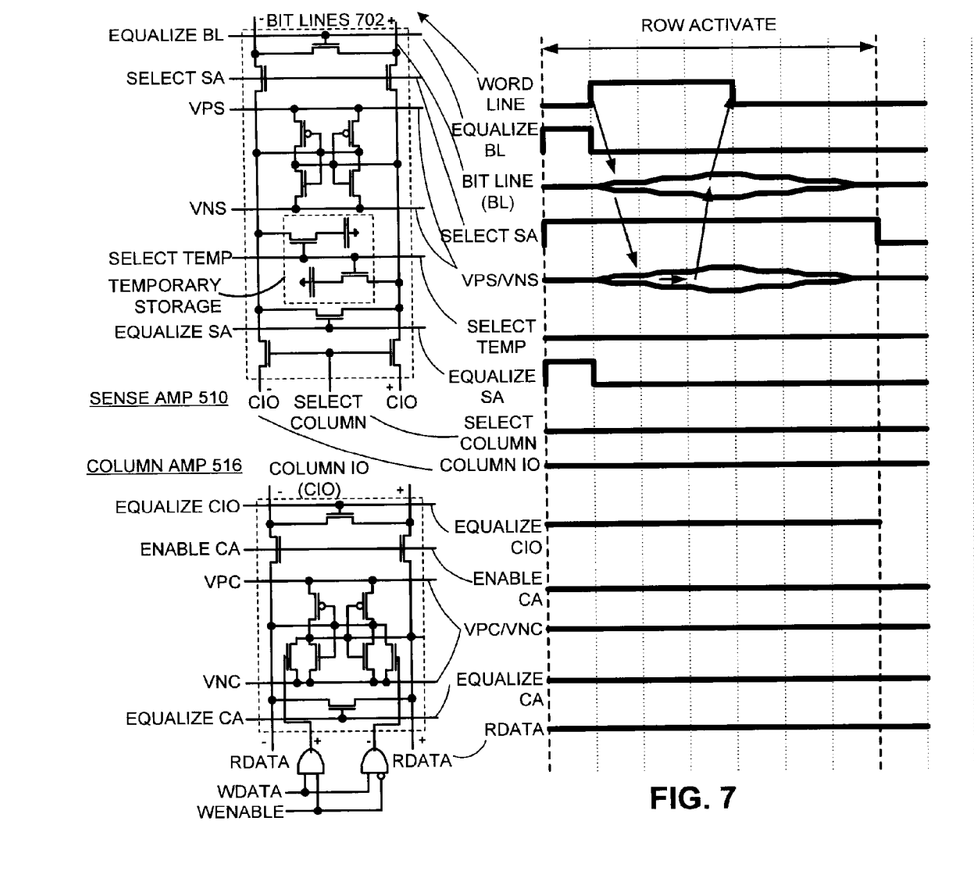
FIG. 7 presents timing diagrams and exemplary signal waveforms associated with activate (refresh) operation of a row of storage cells in a low-power mode.

FIG. 7 presents timing diagrams and signal waveforms associated with activate (refresh) operation of a row of storage cells in a low-power mode. More specifically, the signal waveforms for the VPs/VNs and the bit lines are generated by a voltage-stepping circuitry while carrying out a stepwise activate or refresh operation. In addition to the timing diagrams, FIG. 7 also includes the same embodiments of sense amp 510 and column amp 516 as illustrated in FIG. 5.

Note that in FIG. 7, no column operation is being performed, and no column amplifier action is required. Accordingly, the control signals within column amp 516 remain inactive. As shown in FIG. 7, a stepped voltage source is applied to voltage nodes VPs/VNs within sense amplifier 510 to support row activate. More specifically, the stepping sequence starts in response to activation of a word line (which is asserted in response to row address decode) and reaches a desired level prior to deassertion of the word line. By stepping through the intermediate voltages on the voltage nodes VPs/VNs, the activate operation saves a substantial amount of power because the heavily loaded bit lines present a large amount of capacitance and, hence, can consume a significant amount of power during the activation operation.

Note that during the time period when the word line is asserted (i.e., the line is at "HIGH" state), the addressed storage cell is enabled to output a small quantity of charge (i.e., a sense signal) onto the bit lines 702 (i.e., based on the state of the stored bit). Next, by stepwise ramping up the VPs/VNs supply voltages, sense amp 510 facilitates re-generatively amplifying the small sense signal output from the storage cell into a larger signal. The amplified sense signal on the bit lines is then used to recharge (refresh) the contents of the associated storage cell. Accordingly, by stepwise ramping up the sense amp supply voltages through intermediate voltage levels, a low-power sense and refresh operation is achieved. After the word line is deasserted (i.e., returning to "LOW" state), the sense amplifier supply voltages (VPs/VNs) are stepwise ramped down in magnitude to a neutral, precharge level (VPs=VNs), thereby completing the low-power activate (or refresh) operation.

Figure 8:
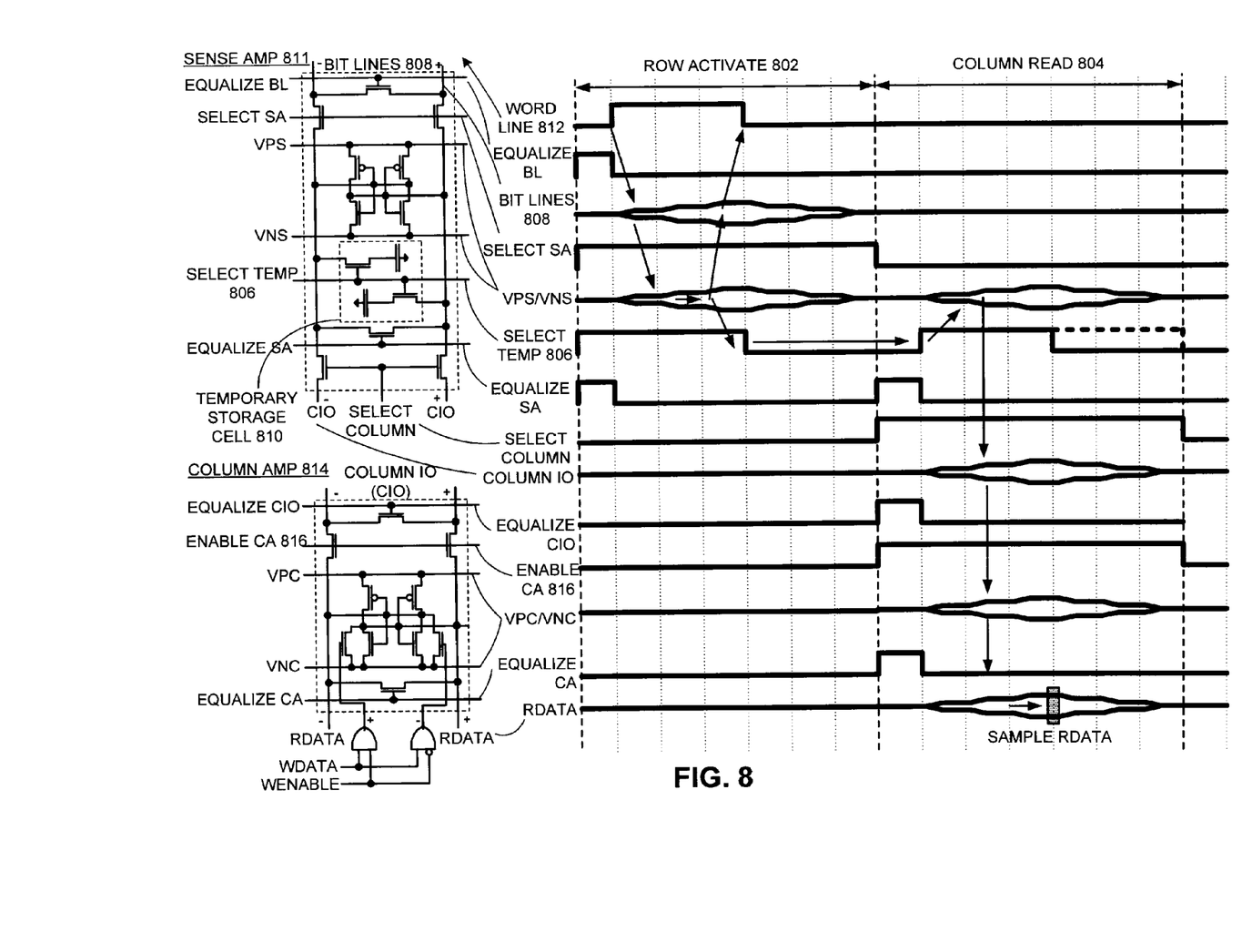
FIG. 8 presents timing diagrams and exemplary signal waveforms associated with activation and column read operations in a low-power mode.

FIG. 8 presents timing diagrams and exemplary signal waveforms associated with activation and column read operation in a low-power mode. More specifically, the stepped signal waveforms within the sense amplifiers and/or column amplifiers are generated by a voltage-stepping circuitry while carrying out a stepwise activation and column read operation.

Note that the activate operation illustrated in FIG. 7 may be immediately followed by a column read operation. Hence, the waveforms in FIG. 8 comprise two consecutive operations: row-activate operation 802 followed by column read operation 804. Note that row activate operation 802 in FIG. 8 is substantially the same as the row activate operation described in conjunction with FIG. 7, except that the select temp signal 806 is activated in FIG. 8. More specifically, select temp signal 806 in the sense amp is activated to store the sensed and amplified data from bit lines 808 into the above-mentioned temporary storage cell 810 (shown within dashed lines in sense amp 811), which has been added into the sense amplifier. In this way, when the word line 812 is deactivated, the contents of the row being activated (i.e., transferred to the sense amplifier bank) become available in these temporary storage cells. Consequently, a second sense operation may be carried out by way of a column read operation to directly sense the data stored in the local temporary storage cells.

Referring to FIG. 8, note that during the column read operation 804, column amps 814 are enabled by maintaining a high voltage level on Enable Calif. 816. Consequently, when select temp 806 is activated again during the column read operation 804, data stored in temporary storage cells 810 (within the sense amplifier bank) is passed, via the column I/O lines (CIO+ and CIO−), to the column amplifiers 814. This, in turn, enables the column amplifiers 814 to begin a stepwise separation of (i.e., establishment of a differential voltage on) the column I/O lines in a similar manner as the stepwise separation of the bit lines in the activation operation. After stepwise sequencing through the intermediate voltages, a full rail-to-rail signal is established within the column amplifiers 814 (i.e., on the RData+ and RData− lines) to provide full logic level voltages to the I/O interface of the memory IC. The amplified data is then sampled from the RData outputs of the CA cell by using interface cell logic.

Note that the data stored in temporary storage cells 810 may be erased during the column read operation by keeping the select temp signal 806 high. Conversely, the data stored in the temporary storage cells may be retained by disabling the select temp signal in the middle of the column access operation (for example, when the potential between VPc and VNc is maximized). The latter facilitates providing multiple reads of the data which is read out during the row activate operation.

Note that another function of the temporary storage cells within the sense amplifier bank is to enable the column I/O lines in the CA to be discharged back to the midpoint (i.e., the neutral or precharge point) without losing the data within the sense amplifier. This is possible because by providing the temporary storage cell to store a small amount of charge (enough to flip the sense amplifier), the column I/O lines may be precharged and yet the row data remains available for subsequent read or write access. Note that this is difficult to achieve using conventional memory design. In another embodiment, the voltage representative of the row data obtained during row activate operation may be retained on the nodes of the sense amplifiers, thereby using the sense amp itself as a temporary storage cell without providing additional circuitry within the sense amp.

In the embodiments illustrated in FIGS. 7 and 8, note that data that was originally stored in the storage cells is transferred to the sense amplifier cells and kept in temporary storage in the sense amplifier cells during the row activate operation, and then transferred to the column amplifier cells during the column read operation. This data is then sampled from the RData outputs of the column amplifier cells by the interface cell logic, and subsequently transmitted to the external environment via interface links Note that one or more read operations may be performed on the row of data held in the temporary storage cells of the sense amplifiers. Note that the data held in the temporary storage cells of the sense amplifiers can be kept for the next read operation or erased during the last read operation by selectively activating the select temp signal.

Figure 9:
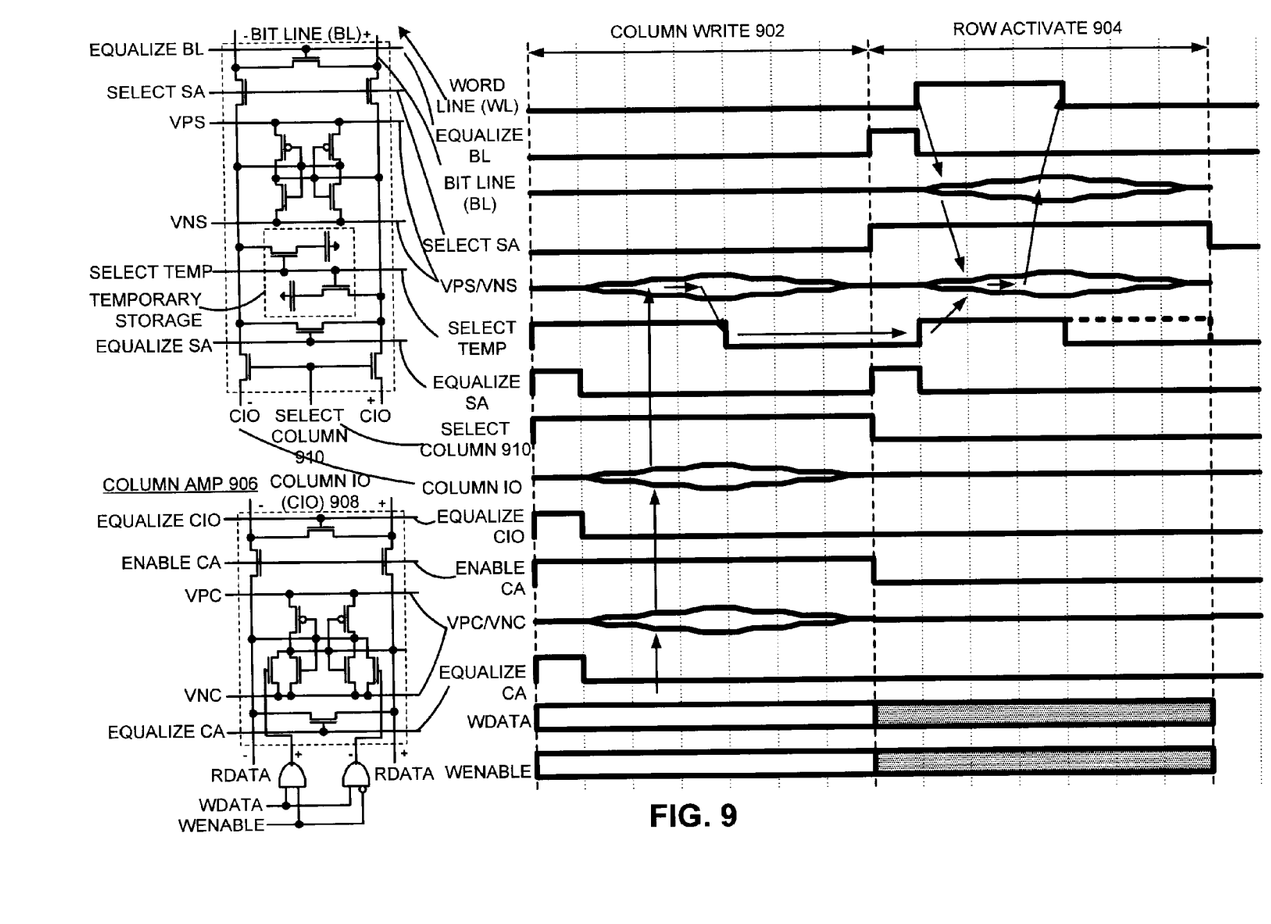
FIG. 9 presents timing diagrams and exemplary signal waveforms associated with column write and activation operations in a low-power mode.

FIG. 9 presents timing diagrams and exemplary signal waveforms associated with column write and activation operations in a low-power mode. More specifically, the stepped signal waveforms within the sense amplifiers and/or column amplifiers are generated by voltage-stepping circuitry while carrying out a stepwise column write operation 902 and a stepwise row activate operation 904. Note that the write and activate operations of FIG. 9 are essentially the reverse of the activate/column-read operations illustrated in FIG. 8.

Note that during a column write operation 902, write data is driven from an external interface of the memory IC onto the write data input (i.e., WData line) at the input of column amplifiers 906. Meanwhile, the write-enable signal (i.e., WEnable line) is asserted to enable the write data to be differentially captured within a column-address-selected subset of the column amplifiers (i.e., driving the write-date inputs into the column amplifier via the AND gates).

Referring to the waveforms in FIG. 9, note that the individual steps within the combined write/activate operations are performed in a reverse order from that of the combined activate/read operations in FIG. 8. More specifically, in FIG. 9, column write operation 902 begins with the WData and WEnable signals being asserted from the interface circuit. Next, the VPc/VNc voltage nodes of the column amplifier begin the voltage-stepping process, through the intermediate voltage levels, to allow the WData to be separated from the Column IO signals.

Note that in parallel to the column write operation, the path from the CIO signals 908 to a subset of the SA cells (selected by the "select column" decoding signal 910) has been enabled, and the corresponding CIO signal voltages are stored onto the equalized temporary storage cells in the SA cells. Note that only a subset of the temporary storage cells receives a differential signal via the CIO wires, while the majority of the temporary storage cells are left deselected, and retain their equalized midpoint voltage levels.

Once the write data has been stored in the temporary storage cells of the row of SA cells having the selected column address, an activate operation is performed on the selected row address of the storage cell array. This selected row is sensed by the sense amplifiers as described above with reference to FIG. 7. However, the select temp signal is also asserted in the selected subset of SA cells, wherein the temporary storage cells have a differential voltage (not an equalized voltage) and will overdrive the signal sensed from the core storage cells in the same position of the selected row. This overdrive operation occurs because the differential voltages from the temporary storage cells are greater than the signal from the core storage cell (approximately twice as much). In this way, the write data from the interface can be merged into the selected row in an energy-efficient manner.

Note that the low-power modes of stepwise ramping through intermediate supply voltages during the activate, read and write operations require a longer time to complete in comparison to regular memory operations, which do not use the intermediate voltages. In some embodiments, a memory device can be configured to selectively operate in either a high-speed mode (using single-step transition of supply voltages) or in a low-power mode (by stepwise ramping of supply voltages). Hence, when speed and/or latency is less critical, the memory may be operated in the stepwise ramping mode by sequencing the VPs/VNs and/or VPc/VNc voltages through stepped voltages to lower the overall power consumption, thereby saving the system power. On the other hand, when higher speed and/or lower latency operation is desirable, the memory device may be switched to a full-speed mode in which the VPs/VNs and/or VPc/VNc lines are switched directly between minimum and maximum voltages, without using the intermediate steps.

Figure 10:
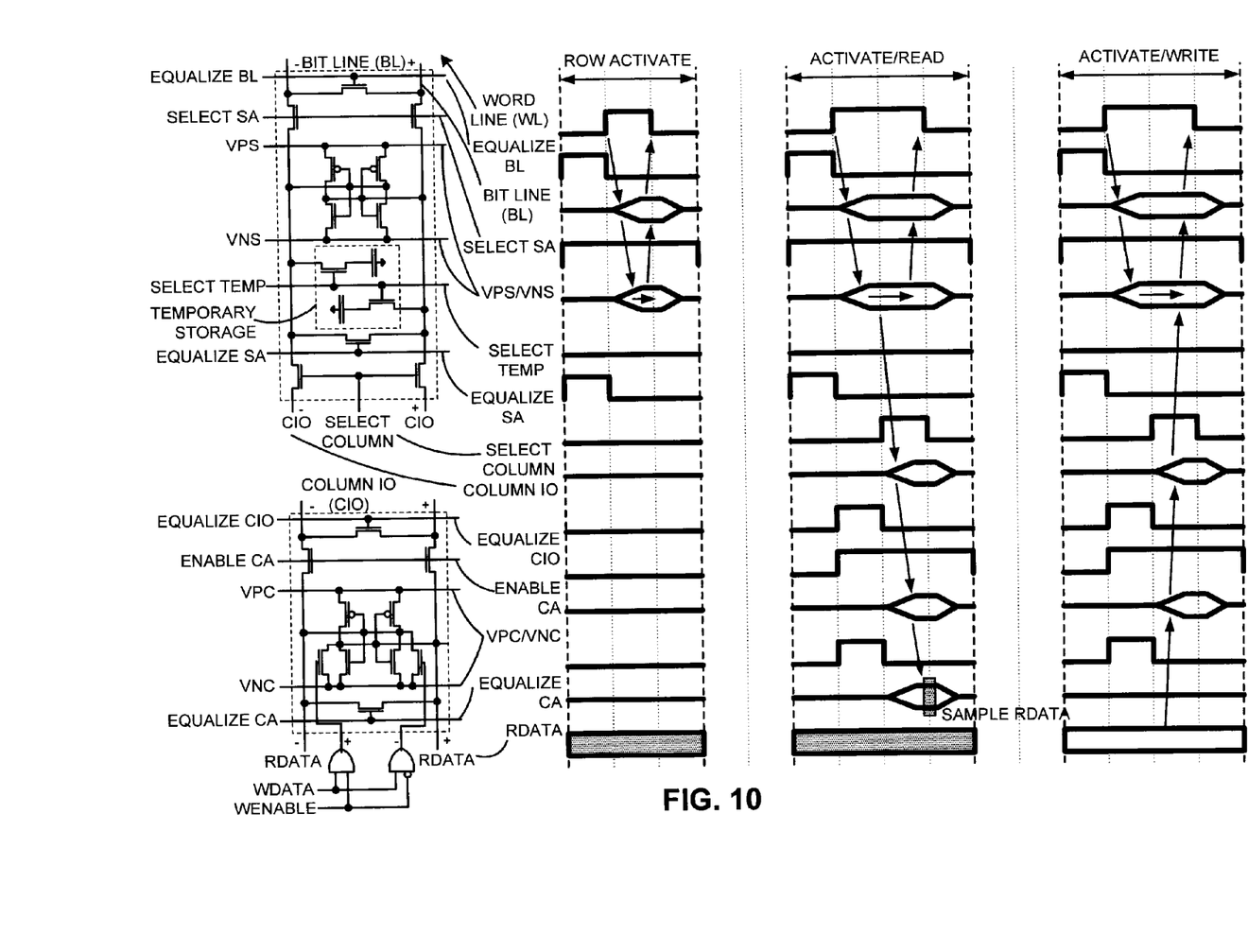
FIG. 10 presents a timing diagram illustrating exemplary signal waveforms generated during a high-speed memory access mode (including row activate, activate-read and activate-write) in which data line voltages are transitioned directly between minimum and maximum voltages in a single step without transitioning though progressively higher or lower voltages.

FIG. 10 presents a timing diagram illustrating exemplary signal waveforms generated during a high-speed memory access mode (including row activate, activate-read and activate-write) in which data line voltages are transitioned directly between minimum and maximum voltages in a single step without transitioning though progressively higher or lower voltages. This operation mode is conventional, and hence is not described with further detail.

Consequently, embodiments of the application provide a memory system that supports a bi-modal operation by enabling selection between low-power-low-speed, and full-power-high-speed (normal) operating modes. This mode selection may be accomplished through one-time programming (e.g., programming a fused or otherwise one-time programmable circuit during device production) or run-time register programming (e.g., in response to a command from a host device such as a memory controller, processor or other control device) to switch between normal and low-power modes according to system usage.

Note that the above-described bi-modal operation can be used in any system that includes a DRAM memory device. Such a system can be, but is not limited to, a mobile system, desktop computer, server, and/or a graphics application. Moreover, the DRAM may be, graphics double data rate (GDDR), GDDR2, GDDR3, GDDR4, GDDR5, and future graphics memory types, and double data rate (DDR), DDR2, DDR3 and future memory types. Moreover, the low-power memory techniques described above may be applicable to other types of memory, for example, flash (and other types of non-volatile memory) and static random access memory (SRAM).

It should be noted that the various circuits disclosed herein may be described using computer-aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL; formats supporting register level description languages like RTL; and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above-described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such a representation or image may thereafter be used during device fabrication, for example, to enable generation of one or more masks that are used to form various components of the circuits in a device-fabrication process.

In summary, this disclosure has described a system for charging a capacitive energy storage device of at least one memory cell within an integrated circuit device from an initial voltage to a final voltage, wherein the integrated circuit device includes a plurality of memory cells which are formed at least in part by capacitive energy storage devices. During operation, the system charges the capacitive energy storage device from the initial voltage to the final voltage stepwise through one or more progressively higher intermediate voltage levels using one or more voltage sources. Specifically, each intermediate voltage level is between the initial voltage and the final voltage, and each voltage source generates a respective intermediate voltage level. Note that charging the capacitive energy storage device through one or more intermediate voltage levels reduces energy dissipation during the charging process.

In some embodiments, the system charges the capacitive energy storage device by: switchably coupling the capacitive energy storage device to a first voltage source during a first time interval; switchably coupling the capacitive energy storage device to a second voltage source during a second time interval; and switchably coupling the capacitive energy storage device to a third voltage source during a third time interval. Specifically, the voltage level of the third voltage source is higher than the voltage level of the second voltage source, and the voltage level of the second voltage source is higher than the voltage level of the first voltage source.

In some embodiments, the one or more progressively higher intermediate voltage levels are substantially evenly spaced between the initial voltage and the final voltage.

In some embodiments, the system discharges the capacitive energy storage device from the final voltage to the initial voltage stepwise through one or more progressively lower intermediate voltage levels using the one or more voltage sources, wherein each voltage source generates a respective intermediate voltage level. Note that discharging the capacitive energy storage device through one or more intermediate voltage levels reduces energy dissipation during the discharging process.

In some embodiments, the system discharges the capacitive energy storage device by: switchably coupling the capacitive energy storage device to a fourth voltage source during a fourth time interval; switchably coupling the capacitive energy storage device to a fifth voltage source during a fifth time interval; and switchably coupling the capacitive energy storage device to a sixth voltage source during a sixth time interval. More specifically, the voltage level of the sixth voltage source is lower than the voltage level of the fifth voltage source, and the voltage level of the fifth voltage source is lower than the voltage level of the fourth voltage source.

In some embodiments, the one or more progressively lower intermediate voltage levels are substantially evenly spaced between the final voltage and the initial voltage.

In some embodiments, the system uses more intermediate voltage levels to further reduce energy dissipation during the charging process.

In some embodiments, the system generates the one or more intermediate voltage levels between the initial voltage and the final voltage using a set of voltage regulators disposed between the initial and final voltages.

This disclosure has described an integrated circuit device, which includes an array of memory cells and data lines coupled to the array of memory cells. The integrated circuit device also includes a receiving circuit which is configured to receive a memory operation request directed to a memory cell within the array of memory cells. Furthermore, the integrated circuit device includes a voltage-stepping circuitry configured to apply a sequence of progressively higher/lower voltages to at least one of the data lines in respective time intervals to transfer charge between the one of the data lines and the requested memory cell.

In some embodiments, the memory operation can include a refresh operation; a read operation; a write operation; and a combination of the above.

In some embodiments, the voltage-stepping circuit is configured to switchably apply the sequence of progressively higher/lower voltages to the inputs of a sense amplifier or to the inputs of a column amplifier associated with the array of memory cells.

In some embodiments, the sense amplifier includes a temporary storage cell which is configured to temporarily store a data value presented on the bit lines of the sense amplifier. Using this temporary storage cell, the data value can be directly accessed from the temporary storage cell during a read operation directed to a memory cell storing the same data value.

In some embodiments, the sense amplifier is configured to control the amount charge on the temporary storage cell which determines how long the data value can be retained on the temporary storage cell.

In some embodiments, the integrated circuit device further includes a control circuit which stores a mode value that indicates an operating mode of the integrated circuit device. Specifically, when the mode value indicates a low-power mode of operation, the voltage-stepping circuitry applies the sequence of progressively higher voltages to the one of the data lines. In contrast, when the mode value indicates a high-speed mode of operation, the voltage-stepping circuitry transitions the voltage applied to the one of the data lines directly to a maximum voltage without stepwise transitioning through the progressively higher voltages.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for charging a capacitive energy storage device of at least one memory cell within an integrated circuit device from an initial voltage to a final voltage, wherein the integrated circuit device comprises a plurality of memory cells which are formed at least in part by capacitive energy storage devices, the method comprising:

charging the capacitive energy storage device from the initial voltage to the final voltage stepwise through one or more progressively higher intermediate voltage levels using one or more voltage sources, wherein each intermediate voltage level is between the initial voltage and the final voltage, and wherein each voltage source generates a respective intermediate voltage level, wherein charging the capacitive energy storage device through one or more intermediate voltage levels reduces energy dissipation during the charging process.

2. The method of claim 1, wherein charging the capacitive energy storage device from the initial voltage to the final voltage stepwise through the one or more progressively higher intermediate voltage levels involves:

switchably coupling the capacitive energy storage device to a first voltage source during a first time interval;

switchably coupling the capacitive energy storage device to a second voltage source during a second time interval; and switchably coupling the capacitive energy storage device to a third voltage source during a third time interval, wherein the voltage level of the third voltage source is higher than the voltage level of the second voltage source, and wherein the voltage level of the second voltage source is higher than the voltage level of the first voltage source.

3. The method of claim 1, wherein the one or more progressively higher intermediate voltage levels are substantially evenly spaced between the initial voltage and the final voltage.

4. The method of claim 1, wherein the method further comprises discharging the capacitive energy storage device from the final voltage to the initial voltage stepwise through one or more progressively lower intermediate voltage levels using the one or more voltage sources, wherein each voltage source generates a respective intermediate voltage level, wherein discharging the capacitive energy storage device through one or more intermediate voltage levels reduces energy dissipation during the discharging process.

5. The method of claim 4, wherein discharging the capacitive energy storage device from the final voltage to the initial voltage stepwise through the one or more progressively lower intermediate voltage levels involves:

switchably coupling the capacitive energy storage device to a fourth voltage source during a fourth time interval;

switchably coupling the capacitive energy storage device to a fifth voltage source during a fifth time interval; and switchably coupling the capacitive energy storage device to a sixth voltage source during a sixth time interval, wherein the voltage level of the sixth voltage source is lower than the voltage level of the fifth voltage source, and the voltage level of the fifth voltage source is lower than the voltage level of the fourth voltage source.

6. The method of claim 3, wherein the one or more progressively lower intermediate voltage levels are substantially evenly spaced between the final voltage and the initial voltage.

7. The method of claim 1, wherein the method further comprises using more intermediate voltage levels to further reduce energy dissipation during the charging process.

8. The method of claim 1, wherein the method further comprises generating the one or more intermediate voltage levels between the initial voltage and the final voltage.

9. The method of claim 8, wherein generating the one or more intermediate voltage levels involves using a set of voltage regulators disposed between the initial and final voltages.

10. A method for performing a memory operation in a memory device, the method comprising:

determining if the memory operation involves a charging or a discharging process;

if the memory operation involves a charging process, performing the charging process stepwise from a low voltage to a high voltage through one or more progressively higher intermediate voltage levels using one or more voltage sources, wherein each intermediate voltage level is between the low voltage and the high voltage, and wherein each voltage source generates a respective intermediate voltage level; and if the memory operation involves a discharging process, performing the discharging process stepwise from the high voltage to the low voltage through one or more progressively lower intermediate voltage levels using the one or more voltage sources.

11. The method of claim 10, wherein the memory operation can include:

a refresh operation;
a read operation;
a write operation; and
a combination of the above.

12. The method of claim 10, wherein performing the charging/discharge process stepwise through the one or more progressively higher/lower intermediate voltage levels involves using a voltage-stepping circuit within the memory device to apply a sequence of progressively higher/lower voltages to the data line.

13. The method of claim 12, wherein using the voltage-stepping circuit to apply the sequence of progressively higher/lower voltages to the data line involves switchably applying the sequence of progressively higher/lower voltages to the inputs of a sense amplifier or to the inputs of a column amplifier within the memory device.

14. The method of claim 10, wherein the method further comprises:

sensing a stored data value from a memory cell in the memory device during refresh operation;

amplifying the sensed data value using a sense amplifier of the memory device; and temporarily storing the amplified data value of the memory cell into a temporary storage cell within the sense amplifier of the memory device, so that the data value can be directly accessed from the temporary storage cell.

15. The method of claim 14, wherein the method further comprises directly reading out a data value of an addressed memory cell from the temporary storage cell during column read operation.

16. A method for controlling a memory device, the method comprising:

determining that a low-power mode of operation is desired within the memory device; and enabling a voltage-stepping circuit within the memory device to apply a sequence of progressively higher voltages to a data line during respective time intervals to transfer charge between the data line and a memory storage element.

17. The method of claim 16, wherein the method further comprises:

determining that a high-speed mode of operation is desired within the memory device; and disabling the voltage-stepping circuit from applying the sequence of progressively higher voltages and instead transitioning directly to a maximum voltage to transfer charge between the data line and the memory storage element.

18. An integrated circuit device for charging a capacitive energy storage device of at least one memory cell within a memory device from an initial voltage to a final voltage, wherein the memory device comprises a plurality of memory cells which are formed at least in part by capacitive energy storage devices, the integrated circuit device comprising:

a voltage-generating circuit for generating one or more intermediate voltage sources between the initial voltage and the final voltage; and a charging circuit for charging the capacitive energy storage device from the initial voltage to the final voltage stepwise through one or more progressively higher intermediate voltage levels using the one or more intermediate voltage sources, wherein charging the capacitive energy storage device through one or more intermediate voltage levels reduces energy dissipation during the charging process.

19. The integrated circuit device of claim 18, wherein the charging circuit is further configured to:

switchably couple the capacitive energy storage device to a first voltage source during a first time interval;

switchably couple the capacitive energy storage device to a second voltage source during a second time interval; and switchably couple the capacitive energy storage device to a third voltage source during a third time interval, wherein the voltage level of the third voltage source is higher than the voltage level of the second voltage source, and wherein the voltage level of the second voltage source is higher than the voltage level of the first voltage source.

20. The integrated circuit device of claim 18, further comprising a discharging circuit for discharging the capacitive energy storage device from the final voltage to the initial voltage stepwise through one or more progressively lower intermediate voltage levels using the one or more intermediate voltage sources, wherein discharging the capacitive energy storage device through one or more intermediate voltage levels reduces energy dissipation during the discharging process.

21. The integrated circuit device of claim 18, wherein the discharging circuit is further configured to:

switchably couple the capacitive energy storage device to a fourth voltage source during a fourth time interval;

switchably couple the capacitive energy storage device to a fifth voltage source during a fifth time interval; and switchably couple the capacitive energy storage device to a sixth voltage source during a sixth time interval, wherein the voltage level of the sixth voltage source is lower than the voltage level of the fifth voltage source and the voltage level of the fifth voltage source is lower than the voltage level of the fourth voltage source.

22. The integrated circuit device of claim 18, wherein the voltage-generating circuit is configured to generate the one or more intermediate voltage levels by using a set of voltage regulators disposed between the initial and final voltages.

23. An integrated circuit device comprising:

an array of memory cells;

data lines coupled to the array of memory cells;

a receiving circuit configured to receive a memory operation request directed to a memory cell within the array of memory cells; and a voltage-stepping circuitry configured to apply a sequence of progressively higher/lower voltages to at least one of the data lines in respective time intervals to transfer charge between the one of the data lines and the requested memory cell.

24. The integrated circuit device of claim 23, wherein the memory operation can include:

a refresh operation;

a read operation;

a write operation; and a combination of the above.

25. The integrated circuit device of claim 23, wherein the voltage-stepping circuit is further configured to switchably apply the sequence of progressively higher/lower voltages to the inputs of a sense amplifier or to the inputs of a column amplifier associated with the array of memory cells.

26. The integrated circuit device of claim 25, wherein the sense amplifier comprises a temporary storage cell which is configured to temporarily store a data value presented on the bit lines of the sense amplifier, so that the data value can be directly accessed from the temporary storage cell during a read operation directed to a memory cell storing the same data value.

27. The integrated circuit device of claim 26, wherein the sense amplifier is configured to control the amount charge on the temporary storage cell which determines how long the data value can be retained on the temporary storage cell.

28. The integrated circuit device of claim 23, further comprising a control circuit which stores a mode value that indicates an operating mode of the integrated circuit device, and wherein when the mode value indicates a low-power mode of operation, the voltage-stepping circuitry applies the sequence of progressively higher voltages to the one of the data lines; and wherein when the mode value indicates a high-speed mode of operation, the voltage-stepping circuitry transitions the voltage applied to the one of the data lines directly to a maximum voltage of the sequence of progressively higher voltages without first transitioning through the progressively higher voltages.

* * * * *